United States Patent
Arata et al.

(10) Patent No.: US 6,558,797 B1
(45) Date of Patent: May 6, 2003

(54) ADHESIVE-COATED COPPER FOIL, AND COPPER-CLAD LAMINATE AND PRINTED CIRCUIT BOARD BOTH OBTAINED WITH THE SAME

(75) Inventors: Michitoshi Arata, Shimodate (JP); Nozomu Takano, Yuki (JP); Kazuhito Kobayashi, Yuki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/869,050

(22) PCT Filed: Dec. 20, 1999

(86) PCT No.: PCT/JP99/07155
§ 371 (c)(1),
(2), (4) Date: Jun. 22, 2001

(87) PCT Pub. No.: WO00/37579
PCT Pub. Date: Jun. 29, 2000

(30) Foreign Application Priority Data

Dec. 22, 1998 (JP) .............................. 10-364387
Dec. 22, 1998 (JP) .............................. 10-364388

(51) Int. Cl.$^7$ ............................................... B32B 27/38
(52) U.S. Cl. .................... 428/418; 428/413; 428/422.8; 428/901; 428/138; 528/106; 528/116; 528/118; 528/119
(58) Field of Search .................. 428/413, 418, 428/422.8, 901, 138; 528/163, 106, 116, 118, 119

(56) References Cited

U.S. PATENT DOCUMENTS 5,806,177 A  9/1998  Hosomi et al.
5,952,447 A * 9/1999 Ikeda .......................... 525/489
6,245,841 B1 * 6/2001 Yeager et al. ................ 523/217

FOREIGN PATENT DOCUMENTS

| JP | 8-253558 | 10/1996 |
| JP | 8-253559 | 10/1996 |
| JP | 10-60138 | 3/1998 |

OTHER PUBLICATIONS

Machine Translation of JPO 08–253558; Oct. 1, 1996, provided by the JPO Industrial Property Digital Library.*

Machine Translation of JPO 08–253559; Oct. 1, 1996, provided by the JPO Industrial Property Digital Liberary.*

Machine Translation of JPO 10–060138; Mar. 3, 1998, provided by the JPO Industrial Property Digital Library.*

Supplementary European Search Report completed Jun. 11, 2002.

* cited by examiner

*Primary Examiner*—Robert Dawson
*Assistant Examiner*—Michael Feely
(74) *Attorney, Agent, or Firm*—Antonelli, Terry, Stout & Kraus, LLP

(57) ABSTRACT

An adhesive-coated copper foil which comprises a copper foil and disposed on one side thereof a layer of an adhesive composition comprising (a) an epoxy resin, (b) a polyfunctional phenol, (c) a curing accelerator as an optional ingredient, and (d) a compound having a triazine ring or isocyanuric ring. The adhesive layer has low hygroscopicity, excellent heat resistance, and satisfactory adhesion to copper foils. By using the adhesive-coated copper foil, a copper-clad laminate and a printed circuit board both having excellent properties can be obtained.

5 Claims, No Drawings

ADHESIVE-COATED COPPER FOIL, AND COPPER-CLAD LAMINATE AND PRINTED CIRCUIT BOARD BOTH OBTAINED WITH THE SAME

TECHNICAL FIELD

The present invention relates to a resin coated copper foil, copper-clad laminates using it, and printed wiring boards using such laminates.

BACKGROUND ART

Abreast with the trend toward miniaturization and higher performance of electronic devices, the printed wiring boards incorporated in such electronic devices are also making headway toward higher degree of density through various means such as multiplication of lamination layers, thinning of the laminated structure, reduction of through-hole diameter and decrease of hole intervals. Further, the printed wiring boards mounted in the information terminal devices such as cellular phones and mobile computers, especially the plastic packages having MPU mounted directly on the boards and the printed wiring boards adapted for various types of modules, are required to be capable of processing a large volume of information at high speed. This calls for speed-up of signal processing, reduction of transmission loss and further downsizing, for which even higher densification and finer wiring of the printed circuit boards are indispensable.

In order to meet the request for finer wiring, a so-called buildup printed wiring board—in which a resin coated copper foil without using glass cloth or the like is attached on the board, then the through-holes and interstitial via holes are formed by laser or other means and then circuits are formed on the board—has been devised and is gaining ground in the art.

On the other hand, for the printed circuit boards adapted with MPU (micro processing units) or the printed circuit boards for modules, a high Tg (glass transition temperature) material with excellent heat resistance is required to secure higher connection reliability than ever demanded. One method for realizing a high Tg material is to cure an epoxy resin with a polyfunctional phenol resin. With this resin system, it is possible to obtain a cured product which is low in water absorption and also has a Tg of 170° C. or higher. However, since the high Tg resin systems have the property of being hard and brittle, they have the problem that when used with a resin coated copper foil, their adhesion to such a copper foil proves to be unsatisfactory. When using a resin system with low adhesion to the copper foil, there tends to take place exfoliation or breaking of the lines in molding or mounting of the substrate. Adhesion to the copper foil will become an important factor as the densification of wiring advances in the future.

As a technique for improving adhesion between copper foil and resin, it has been practiced to treat the copper foil with a coupling agent, as for instance disclosed in JP-A-54-48879, but in the case of the hard and brittle resin system such as high Tg resin system, mere treatment of the copper foil with a commercially available coupling agent can not provide a stronger chemical adhesion to the resin than possible with the conventional FR-4 material. Also, when the copper foil is treated with a silane coupling agent, there remains a residue on the substrate surface after formation of circuits, which may exert adverse effect on prevention of staining in the ensuing plating step or adhesion to the solder resist.

DISCLOSURE OF THE INVENTION

The present invention has been made in view of these circumstances, and it is intended to provide a resin coated copper foil which has low water absorption, high heat resistance and good adhesion to the copper foil; copper-clad laminates using the said copper foil, and printed wiring boards using such laminates.

The present invention provides a resin coated copper foil obtained by applying on one side of a copper foil an adhesive composition comprising as essential components (a) an epoxy resin, (b) a polyfunctional phenol, (c) a curing accelerator as required, and (d) a compound having a triazine ring or an isocyanuric ring.

The present invention also provides the copper-clad laminates obtained by using the said resin coated copper foil, and the printed wiring boards obtained by forming circuits on said copper-clad laminates.

BEST MODE FOR CARRYING OUT THE INVENTION

A detailed description of the present invention follows.

The adhesive composition used for the resin coated copper foil of the present invention is a thermosetting resin composition containing an epoxy resin.

As the epoxy resin (a) constituting a component of the said adhesive composition, there can be used, for instance, bisphenol A epoxy resins, bisphenol F epoxy resins, bisphenol S epoxy resins, bisphenol epoxy resins, phenolic novolak epoxy resins, cresol novolak epoxy resins, bisphenol A novolak epoxy resins, bisphenol F novolak epoxy resins, phenolic salicylaldehyde novolak epoxy resins, alicyclic epoxy resins, aliphatic chain epoxy resins, glycidyl ester type epoxy resins, glycidyl-etherified products of bifunctional phenols, glycidyl-etherified products of bifunctional alcohols, glycidyl-etherified products of polyphenols, and their hydrogenation products and halides. These compounds may be used either singly or as a combination of two or more of them.

The polyfunctional phenol (b), which is another component of the said adhesive (or thermosetting resin) composition, can be used with or in place of a condensate of bisphenol A and formaldehyde. Examples of the polyfunctional phenols usable in this invention include bisphenol F, bisphenol A, bisphenol S, polyvinyl phenol, novolak resins obtainable by reacting phenols such as phenol, cresol, alkyl phenols (such as p-t-butylphenol and p-octylphenol), catechol, bisphenol F, bisphenol A, bisphenol S, etc., with aldehydes such as formaldehyde and acetaldehyde in the presence of an acidic catalyst, and their halides. These phenols can be used either singly or by combining two or more of them. Novolak resins, especially those obtainable by reacting bisphenol A with aldehydes are preferably used.

The amount of the polyfunctional phenol to be blended in the composition is selected such that the amount of the phenolic hydroxyl group will fall within the range of 0.5 to 1.5 equivalent to one equivalent of epoxy group.

In the said adhesive composition, a curing accelerator (c) may be contained as required. As such a curing accelerator, it is possible to use any compound having a catalytic function to accelerate the etherification reaction of epoxy resin and phenolic hydroxyl group. Such compounds include alkaline metal compounds, alkaline earth metal compounds, imidazole compounds, organic phosphorus compounds, secondary amines, tertiary amines, and quaternary ammonium salts. Use of imidazole having its imino group masked with acrylonitrile, isocyanate, melamine acrylate or the like is preferable as it can provide a prepreg having 2 or more times longer pot life than conventional prepregs.

It is possible to use two or more types of curing accelerator. This curing accelerator is used in an amount of preferably 0.01 to 5 parts by weight per 100 parts by weight of the epoxy resin. If the amount of the curing accelerator is less than 0.01 part by weight, its accelerating effect may prove to be unsatisfactory, and if its amount exceeds 5 parts by weight, the composition tends to deteriorate in pot life.

Examples of the said imidazole compounds include imidazole, 2-ethylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazole, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline, and 2-phenyl-4-methylimidazoline. As the masking agent, acrylonitrile, phenylene diisocyanate, toluidine isocyanate, naphthalene diisocyanate, methylenebisphenyl isocyanate, melamine acrylate and the like can be used.

The compound having a triazine or isocyanuric ring, used as yet another component (d) of the said adhesive composition, is not subject to any specific restrictions, but the compounds represented by the following formula (I) or (II) are preferably used,

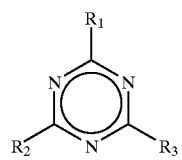
(I)

wherein $R_1$, $R_2$ and $R_3$ represent independently an unsaturated group such as amino group, alkyl group, phenyl group, hydroxyl group, hydroxyalkyl group, ether group, ester group, acid group or vinyl group, or a cyano group;

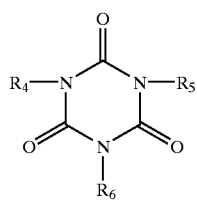
(II)

wherein $R_4$, $R_5$ and $R_6$ represent independently an unsaturated group such as amino group, alkyl group, phenyl group, hydroxyl group, hydroxyalkyl group, ether group, ester group, acid group or vinyl group, or a cyano group.

In the above formula (I), preferably at least one of $R_1$, $R_2$ and $R_3$ is an amino group.

The compounds represented by the formula (I), to be concrete, include, for example, melamine, guanamine derivatives such as acetoguanamine and benzoguanamine, cyanuric acid, and cyanuric acid derivatives such as methyl cyanurate, ethyl cyanurate and acetyl cyanurate. For use as a curing agent, it is preferable that two or all three of $R_1$, $R_2$ and $R_3$ are an amino group.

The compounds represented by the formula (II) include, for example, isocyanuric acid and isocyanuric acid derivatives such as methyl isocyanurate, ethyl isocyanurate, allyl isocyanurate, 2-hydroxyethyl isocyanurate, 2-carboxyethyl isocyanurate, and chlorinated isocyanuric acid.

Polycondensates of phenols, compounds of the formula (I) or (II) and aldehydes, and their glycidyl-etherified products are also usable as the compound having a triazine or isocyanuric ring.

The phenols usable for the above purpose are not specified; it is possible to use, for instance, phenol, alkylphenols such as cresol, xylenol, ethylphenol and butylphenol, polyvalent phenols such as bisphenol A, bisphenol F, bisphenol S, resorcin and catechol, phenylphenol, and aminophenol. These phenols may be used either singly or as a combination of two or more of them.

Examples of the compounds of the formula (I) or (II) usable as a starting material of the said condensates include those mentioned above.

A typical method for obtaining the reaction product of a phenol, a compound of the formula (I) or (II) and an aldehyde is described below. Initially, a phenol, an aldehyde and a compound of the formula (I) or (II), such as mentioned above, are reacted in the presence of a basic or acidic catalyst. In this operation, the pH of the system is not specifically limited, but in view of the fact that most of the compounds having a triazine or isocyanuric ring are easily dissolved in a basic solution, it is preferable to carry out the reaction in the presence of a basic catalyst, and an amine is preferably used as such a basic catalyst. The order of reaction of the starting materials is also not restricted; for example, a phenol and an aldehyde may be reacted initially, followed by the addition of a compound of the formula (I) or (II), or conversely a compound of the formula (I) or (II) and an aldehyde may be reacted first, followed by the addition of a phenol, or the starting materials may be added all together.

The molar ratio of aldehyde to phenol in the above reaction is not specified, but it is usually 0.2~1.5, preferably 0.4~0.8. The weight ratio of the compound of the formula (I) or (II) to phenol is (10~98):(90~2), preferably (50~95):(50~5). When the weight ratio of phenol is less than 10%, it becomes difficult to resinify the mixture, and when this weight ratio exceeds 98%, the desired flame retarding effect can not be obtained.

The catalyst used in the above reaction is not specified, but among its representative examples are hydroxides of alkaline metals and alkaline earth metals, such as sodium hydroxide, potassium hydroxide and barium hydroxide; their oxides; ammonia, primary to tertiary amines, hexamethylenetetramine, etc.; inorganic acids such as hydrochloric acid, sulfuric acid and sulfonic acid; organic acids such as oxalic acid and acetic acid; Lewis acids, and divalent metal salts such as zinc acetate.

As it is undesirable that the inorganic matter such as metal be left as a catalyst residue after the reaction, it is recommendable to use an amine as the basic catalyst and an organic acid as the acid catalyst. The reaction may be carried out in the presence of a solvent for control of the reaction. Then the reaction mixture is neutralized and washed with water as required for removing the impurities such as salts. This, however, is preferably not conducted in case an amine is used as the catalyst. After the reaction is over, the unreacted aldehyde and phenol and the solvent are removed by a conventional method such as normal pressure distillation, vacuum distillation, etc. In this operation, it is desirable to remove the unreacted aldehyde and methylol. A heat treatment at 120° C. or above is necessary for obtaining a resin composition which is substantially free of unreacted aldehyde and methylol group. It is advised to conduct heating and distillation sufficiently according to a conventional method used for obtaining novolak resins. In this operation, though not compulsory, the amount of the unreacted monofunctional phenol monomer is preferably held down to 2% or less as mentioned above.

There is thus obtained a polycondensate of a phenol, a compound of the formula (I) or (II) and an aldehyde.

Of these condensates, the novolak resins obtained by reacting melamine, a phenol and formaldehyde in the presence of an acid catalyst are commercially available as melamine-modified phenol resin or melamine-modified phenolic novolak under the trade name of, for instance, Phenolite LA-7054 (Dainippon Ink and Chemicals, Inc.), PS-6313 and PS-6333 (Gunei Chemical Industries Co., Ltd.).

The compounds having a triazine or isocyanuric ring can be used as a combination of two or more of them. These compounds are preferably added so that the nitrogen content will become 0.1 to 10% by weight based on the total amount of the resin solid matters ((a), (b) and (c)) in said adhesive composition. When the nitrogen content is less than 0.1% by weight, the effect of improving adhesion to the copper foil tends to become unsatisfactory, and when the nitrogen content exceeds 10% by weight, water absorption of the composition tends to increase.

In the said adhesive composition, in order to make it flame-retardant, a halogenated epoxy resin can be blended at least as part of the epoxy resin. As such a halogenated epoxy resin, there can be used, for instance, halides of bisphenol A epoxy resins, bisphenol F epoxy resins, bisphenol S epoxy resins, phenolic novolak epoxy resins, cresol novolak epoxy resins, bisphenol A novolak epoxy resins, bisphenol F novolak epoxy resins, phenolic salicylaldehyde novolak epoxy resins, alicyclic epoxy resins, aliphatic chain epoxy resins, glycidyl ester type epoxy resins, glycidyl-etherified products of bifunctional phenols, and glycidyl-etherified products of bifunctional alcohols.

Also, for making the composition flame-retardant, it is possible to use a halogenated polyfunctional phenol at least as part of the polyfunctional phenol. Examples of such halogenated polyfunctional phenols include the halides of bisphenol A, bisphenol F, bisphenol S, polyvinylphenol, and novolak resins of phenol, cresol, alkylphenol, catechol, bisphenol F and the like.

Such a halide is used so that the halogen content will become 5 to 30% by weight, preferably 10 to 20% by weight, based on the total amount of the resin solid matters ((a), (b) and (d)) in said adhesive composition. A too low halogen content results in an unsatisfactory flame-retarding effect, while a too high halogen content tends to lower the glass transition temperature of the cured product of the thermosetting resin composition.

It is also possible to blend antimony trioxide, tetraphenylphosphine or the like as flame-retardant.

An inorganic filler or fillers may be blended in the adhesive composition. The inorganic fillers usable in this invention include powders of crystal silica, fused silica, alumina, zircon, aluminum hydroxide, magnesium hydroxide, calcium silicate, aluminum silicate, mica, calcium carbonate, silicon carbide, silicon nitride, boron nitride, beryllia, magnesia, zirconia, forsterite, stearite, spinel, murite, titania, etc., single-crystal fibers of potassium titanate, silicon carbide, silicon nitride, alumina, etc., glass fiber, various types of whiskers and the like. One or more of these fillers may be blended. The amount of the filler(s) to be blended is preferably 650 parts by weight or less, especially 200 parts by weight or less, per 100 parts by weight of the combined amount of the resin solid matters ((a), (b) and (c)) in the said adhesive composition.

The said adhesive composition may also contain a high-molecular weight substance. Examples of the high-molecular weight substances usable in the composition are phenoxy resins, polyamide resins, polyphenylene ethers, polybutylene, polybutadiene, butadiene-acrylonitrile rubber and silicon rubber. These high-molecular weight substances may be used either singly or as a combination of two or more of them. Such a high-molecular weight substance(s) is blended in an amount of preferably 0 to 150 parts by weight, especially 30 to 100 parts by weight, per 100 parts by weight of the combined amount of the resin solid matters ((a), (b) and (c)) in the said adhesive composition.

Preferably the said adhesive composition is dissolved or dispersed in a solvent (e) to form a varnish. The solvents usable for this purpose include ketone type solvents such as acetone, methyl ethyl ketone and methyl isobutyl ketone, aromatic hydrocarbon type solvents such as toluene and xylene, ester type solvents such as ethyl acetate, ether type solvents such as ethylene glycol monomethyl ether, amide type solvents such as N,N-dimethylacetamide, and alcohol type solvents such as methanol and ethanol. These solvents may be used either singly or as a mixture of two or more of them. The varnish concentration may be properly decided in consideration of handling and other factors.

The varnish obtained by blending the said materials (a) to (e) ((c) and (e) being used as required) is applied to a copper foil and dried in a drying oven at 80 to 200° C. to produce a resin coated copper foil.

The copper foil used here is not subject to any specific restrictions; it is possible to use any type of copper foil which is generally used in the field of printed wiring boards. For instance, a 5 to 200 μm thick copper foil usually used for the laminates is employed. It is also possible to use a composite foil of a three-layer structure in which a 0.5 to 15 μm copper foil and a 10 to 300 μm copper foil are provided on both sides of an intermediate layer of nickel, nickel-phosphorus alloy, nickel-tin alloy, nickel-iron alloy, lead, lead-tin alloy or the like, or a composite foil comprising a copper foil combined with aluminum.

Drying in the production of the resin coated copper foil means removal of the solvent in case a solvent is used and elimination of fluidity at room temperature in case no solvent is used. The adhesive of the resin coated copper foil is preferably dried to produce a B stage.

The adhesive thickness of the resin coated copper foil, in case laminated on an interlayer circuit board, is preferably greater than the thickness of the conductor forming the interlayer circuits, and is usually 3 to 200 μm. The thickness may be made greater, and in such a case, coating and drying may be repeated several times.

The "interlayer circuit board" referred to herein is a circuit board comprising a substrate of paper, fiber or other material in which a resin has been impregnated and cured, with circuits being formed on one or both sides of the substrate. It can be a multi-layer wiring board having through holes and/or via holes formed for electrically connecting conductor circuits.

Laminate molding of the resin coated copper foil and interlayer circuit boards is usually carried out at a temperature in the range of 150 to 180° C., in some cases 130 to 200° C., under a pressure in the range of usually 2 to 8 MPa, in some cases 0.5 to 20 MPa, which are properly selected depending on the press capacity, desired laminate thickness and other factors.

Circuits are formed on the obtained copper-clad laminate to complete a printed wiring board or a multi-layer printed wiring board.

The circuit forming work is conducted after laminate molding of the resin coated copper foil and the interlayer circuit boards in which the connecting holes have been formed by laser or drilling before laminating, by following the procedure comprising the steps of forming a resist pattern on the copper foil surface, removing the unnecessary portion of the copper foil by etching, electrically connecting the interlayer circuits by plating, and stripping off the resist pattern. Each step can be accomplished by a conventional method. In some cases, drilling for forming through holes, etc., may be conducted after laminate molding of the resin coated copper foil and the interlayer circuit boards.

The resin coated copper foils may be built up by laminating a desired number of foils while forming circuits.

The present invention is explained in more detail in the following Examples, but it should be recognized that the scope of the present invention is not restricted to these Examples.

EXAMPLE 1

100 parts by weight of a bisphenol A novolak epoxy resin (Epiclon N-865 (trade name) produced by Dainippon Ink and Chemicals, Inc.) as epoxy resin (a), 24 parts by weight of a phenolic novolak (HP-850N (trade name) produced by Hitachi Chemical Company, Ltd.; hydroxy equivalent: 108) as polyfunctional phenol (b), and 33.5 parts by weight of a melamine-modified phenolic novolak (Phenolite LA-7054 (trade name) produced by Dainippon Ink and Chemicals, Inc.; nitrogen content: 14 wt %) as compound having a triazine or isocyanuric ring (d) were dissolved in methyl ethyl ketone. Further, 0.3 part by weight of 1-cyanoethyl-2-ethyl-4-methylimidazole was blended as curing accelerator (c) to prepare a varnish with a nonvolatile content of 70% by weight.

EXAMPLE 2

100 parts by weight of Epiclon N-865, 22.6 parts by weight of HP-850N, 12.9 parts by weight of Phenolite LA-7054 and 46.8 parts by weight of tetrabromobisphenol A (Fire Guard FG-2000 (trade name) produced by Teijin Chemicals Ltd.; hydroxy equivalent: 272; bromine content: 58 wt %) were dissolved in methyl ethyl ketone, and 0.3 part by weight of 1-cyanoethyl-2-ethyl-4-methylimidazole was blended therein as curing accelerator to prepare a varnish with a nonvolatile content of 70% by weight.

EXAMPLE 3

100 parts by weight of Epiclon N-865, 24 parts by weight of HP-850N and 33.5 parts by weight of Phenolite LA-7054 were dissolved in methyl ethyl ketone. Further, 39.5 parts by weight of fused silica (QZ FUSED SS-G1 (trade name) produced by Izumitec Co., Ltd.) was blended in the solution, and 0.3 part by weight of 1-cyanoethyl-2-ethyl-4-methylimidazole was blended as curing accelerator to prepare a varnish with a nonvolatile content of 60% by weight.

EXAMPLE 4

100 parts by weight of Epiclon N-865, 24 parts by weight of HP-850N, 33.5 parts by weight of Phenolite LA-7054 and 52.6 parts by weight of a bromine-containing phenoxy resin (YPB-40 produced by Tohto Kasei Co., Ltd.) were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

EXAMPLE 5

100 parts by weight of Epiclon N-865, 22.6 parts by weight of HP-850N, 12.9 parts by weight of Phenolite LA-7054, 46.8 parts by weight of Fire Guard FG-2000 and 60.9 parts by weight of YPB-40 were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

EXAMPLE 6

100 parts by weight of Epiclon N-865, 5.8 parts by weight of HP-850, 31.1 parts by weight of a melamine-modified phenolic novolak (Phenolite LA-7054V (trade name) produced by Dainippon Ink and Chemicals, Inc.; nitrogen content: 7 wt %), 47.6 parts by weight of Fire Guard FG-2000 and 61.6 parts by weight of YPB-40 were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

EXAMPLE 7

100 parts by weight of a brominated bisphenol A epoxy resin (Sumiepoxy (Sumiepoxy) ESB400T (trade name) produced by Sumitomo Chemical Co., Ltd.; epoxy equivalent: 400; bromine content: 49 wt %), 19.5 parts by weight of HP-850N, 9 parts by weight of Phenolite LA-7054 and 42.9 parts by weight of YPB-40 were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

EXAMPLE 8

100 parts by weight of Epiclon N-865, 33.6 parts by weight of HP-850N, 46.7 parts by weight of Fire Guard FG-2000 and 70.8 parts by weight of YPB-40 were dissolved in methyl ethyl ketone. 0.3 part by weight of 1-cyanoethyl-2-ethyl-4-methylimidazole was blended therein as curing accelerator, and then 31.9 parts by weight of melamine (nitrogen content: 66.7 wt %) was further blended to prepare a varnish with a nonvolatile content of 60% by weight.

Comparative Example 1

100 parts by weight of Epiclon N-865, 33.6 parts by weight of HP-850N and 46.7 parts by weight of Fire Guard FG-2000 were dissolved in methyl ethyl ketone, and 0.3 part by weight of 1-cyanoethyl-2-ethyl-4-methylimidazole was blended as curing accelerator to prepare a varnish with a nonvolatile content of 70% by weight.

Comparative Example 2

100 parts by weight of Epiclon N-865, 33.6 parts by weight of HP-850N, 46.7 parts by weight of Fire Guard FG-2000 and 60.2 parts by weight of YPB-40 were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

Comparative Example 3

100 parts by weight of Epiclon N-865, 61.4 parts by weight of Phenolite LA-7054 and 53.9 parts by weight of YPB-40 were dissolved in methyl ethyl ketone, and 0.3 parts by weight of 1-cyanoethyl-2-ethyl-4-methylimidazole was blended as curing accelerator to prepare a varnish with a nonvolatile content of 60% by weight.

Comparative Example 4

100 parts by weight of Epiclon N-865, 38.7 parts by weight of Phenolite LA-7054, 48.5 parts by weight of Fire Guard FG-2000 and 62.5 parts by weight of YPB-40 were dissolved in methyl ethyl ketone, and 0.3 parts by weight of 1-cyanoethyl-2-ethyl-4-methylimidazole was blended as curing accelerator to prepare a varnish with a nonvolatile content of 60% by weight.

Comparative Example 5

One part by weight of dicyandiamide dissolved in ethylene glycol monomethyl ether was blended with 80 parts by weight of a low-brominated epoxy resin (DER-518 (trade name) produced by Dow Chemical Japan, Ltd.; bromine content: 21 wt %; epoxy equivalent: 485) and 20 parts by weight of an o-cresol novolak epoxy resin (Epiclon N-673 (trade name) produced by Dainippon Ink and Chemicals, Inc.; epoxy equivalent: 213). 33.8 parts by weight of YPB-40 was further blended therein, and then 0.2 part by weight of 1-cyanoethyl-2-ethyl-4-methylimidazole was blended as curing accelerator to prepare a varnish with a nonvolatile content of 60% by weight.

Each of the varnishes produced in Examples 1 to 8 and Comparative Examples 1 to 5 was applied to a 0.018 mm thick copper foil and heated at 160° C. for 3 minutes to obtain a copper foil having a 50 μm thick adhesive layer (resin coated copper foil). The thus obtained resin coated copper foil had its adhesive side placed on both sides of a 0.4 mm thick circuit-formed printed wiring board (MCL E-679 (trade name) produced by Hitachi Chemical Company, Ltd.; a both-side copper-clad glass cloth reinforced epoxy resin laminate; copper foil thickness: 18 μm) and pressed under the conditions of 170° C., 2.5 MPa and 90 minutes to make a copper-clad laminate with interlayer circuits. Each of the obtained copper-clad laminates with interlayer circuits was subjected to the determination of Tg, copper foil peel strength, solder heat resistance and water absorption. Results are shown in Tables 1 and 2.

The tests and determinations were conducted as described below.

Tg: The copper foil was etched and Tg of the laminate was determined by thermomechanical analysis (TMA) (unit: ° C.).

Copper foil peel strength: A 10 mm wide line was formed on the substrate by etching and it was stripped off in the vertical direction while measuring its peel strength by a tensile tester (unit: kN/m).

Solder heat resistance: After etching the copper foil, the laminate was kept in a pressure cooker tester for 2 hours and then immersed in a 260° C. solder bath for 20 seconds, and its appearance was examined visually for evaluation. In the tables, ○ indicates that the test piece had no abnormality, Δ indicates that the test piece suffered measling, and x indicates that the test piece had a blister or blisters.

Water absorption: After etching the copper foil, the laminate was kept in the pressure cooker tester for 4 hours. Water absorption was calculated from the difference in weight before and after retention in the tester (unit: wt %).

Examples 1 to 8 showed high copper foil peel strength (1.5 kN/m or above) in the ordinary state and maintained approximately 50% of the ordinary state peel strength even when placed under 200° C., indicating that the deterioration at high temperatures is small. Also, because of use of a phenolic novolak as curing agent, Examples 1 to 8 had a high Tg of around 140 to 175° C. and showed high solder heat resistance and low water absorption.

In contrast, Comparative Examples 1 and 2 were low in copper foil peel strength in the ordinary state and at 200° C. Comparative Examples 3 and 4, in which no phenolic novolak was used as curing agent, were poor in heat resistance. Comparative Example 5, a case where dicyandiamide was used, had a low Tg and was also low in copper foil peel strength at 200° C., high in water absorption and poor in solder heat resistance.

TABLE 1

| ITEMS | | EXAMPLE | | | | | | | |
|---|---|---|---|---|---|---|---|---|---|
| | | 1 | 2 | 3 | 4 | 5 | 6 | 7 | 8 |
| Tg (° C.) | | 175 | 173 | 175 | 172 | 171 | 172 | 140 | 173 |
| COPPER FOIL PEEL STRENGTH (kN/m) | ORDINARY STATE | 1.5 | 1.6 | 1.5 | 1.6 | 1.6 | 1.6 | 1.7 | 1.5 |
| | 200° C. | 0.7 | 0.7 | 0.7 | 0.8 | 0.7 | 0.8 | 0.6 | 0.8 |
| SOLDER HEAT RESISTANCE | | ○ | ○ | ○ | ○ | ○ | ○ | ○ | ○ |
| WATER ABSORPTION (%) | | 0.6 | 0.6 | 0.4 | 0.6 | 0.6 | 0.5 | 0.4 | 0.5 |

TABLE 2

| ITEMS | | COMP. EXAMPLE | | | | |
|---|---|---|---|---|---|---|
| | | 1 | 2 | 3 | 4 | 5 |
| Tg (° C.) | | 174 | 171 | 163 | 158 | 118 |
| COPPER FOIL PEEL STRENGTH (kN/m) | ORDINARY STATE | 1.2 | 1.3 | 1.6 | 1.5 | 1.7 |
| | 200° C. | 0.4 | 0.3 | 0.6 | 0.6 | 0.1 |
| SOLDER HEAT RESISTANCE | | ○ | ○ | Δ | Δ | x |
| WATER ABSORPTION (%) | | 0.6 | 0.5 | 0.7 | 0.6 | 1.0 |

EXAMPLE 9

100 parts by weight of a bisphenol A novolak epoxy resin (Epiclon N-865 (trade name) produced by Dainippon Ink and Chemicals, Inc.; epoxy equivalent: 207) as epoxy resin (a), 24.5 parts by weight of a bisphenol A novolak (Phenolite VH-4170 (trade name) produced by Dainippon Ink and Chemicals, Inc.; hydroxy equivalent: 114) as bisphenol A/formaldehyde condensate (b), and 34.2 parts by weight of a melamine-modified phenolic novolak (Phenolite LA-7054 (trade name) produced by Dainippon Ink and Chemicals, Inc.; nitrogen content: 14 wt %) as compound having a triazine or isocyanuric ring (d) were dissolved in methyl ethyl ketone, and 0.3 part by weight of 1-cyanoethyl-2-ethyl-4-methylimidazole was blended as curing accelerator to prepare a varnish with a nonvolatile content of 70% by weight.

EXAMPLE 10

100 parts by weight of Epiclon N-865, 23.2 parts by weight of Phenolite VH-4170, 13.3 parts by weight of Phenolite LA-7054 and 47.5 parts by weight of tetrabromobisphenol A (Fire Guard FG-2000 (trade name) produced by Teijin Chemicals Ltd.; hydroxy equivalent: 272; bromine content: 58 wt %) were dissolved in methyl ethyl ketone, and 0.3 part by weight of 1-cyanoethyl-2-ethyl-4-methylimidazole was blended as curing accelerator to prepare a vanish with a nonvolatile content of 70% by weight.

EXAMPLE 11

100 parts by weight of Epiclon N-865, 24.5 parts by weight of Phenolite VH-4170 and 34.2 parts by weight of Phenolite LA-7054 were dissolved in methyl ethyl ketone. In this solution, 39.8 parts by weight of fused silica (QZ FUSED SS-G1 (trade name) produced by Izumitec Co., Ltd. was blended, and then 0.3 part by weight of 1-cyanoethyl-2-ethyl-4-methylimidazole was further blended as curing accelerator to prepare a varnish with a nonvolatile content of 60% by weight.

EXAMPLE 12

100 parts by weight of Epiclon N-865, 24.5 parts by weight of Phenolite VH-4170, 34.2 parts by weight of Phenolite LA-7054 and 53 parts by weight of a bromine-containing phenoxy resin (YPB-40 (trade name) produced by Tohto Kasei Co., Ltd.) were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

EXAMPLE 13

100 parts by weight of Epiclon N-865, 23.2 parts by weight of Phenolite VH-4170, 13.3 parts by weight of Phenolite LA-7054, 47.5 parts by weight of Fire Guard FG-2000 and 61.4 parts by weight of YPB-40 were dissolved in methyl ethyl ketone, and 0.3 part by weight of 1-cyanoethyl-2-ethyl-4-methylimidazole was blended as curing accelerator to prepare a vanish with a nonvolatile content of 60% by weight.

EXAMPLE 14

100 parts by weight of Epiclon N-865, 5.8 parts by weight of Phenolite VH-4170, 31.3 parts by weight of a melamine-modified phenolic novolak (Phenolite LA-5054V (trade name) produced by Dainippon Ink and Chemicals, Inc.; nitrogen content: 7 wt %), 47.9 parts by weight of Fire Guard FG-2000 and 61.8 parts by weight of YPB-40 were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

EXAMPLE 15

100 parts by weight of a brominated bisphenol A epoxy resin (Sumiepoxy ESB400T (trade name) produced by Sumitomo Chemical Co., Ltd.; epoxy equivalent: 400; bromine content: 49 wt %), 20.2 parts by weight of Phenolite; VH-4170, 9.3 parts by weight of Phenolite LA-7054 and 43.3 parts by weight of YPB-40 were dissolved in methyl ethyl ketone, and 0.3 part by weight of 1-cyanoethyl-2-ethyl-4-methylimidazole was blended as curing accelerator to prepare a vanish with a nonvolatile content of 60% by weight.

EXAMPLE 16

100 parts by weight of Epiclon N-865, 35.3 parts by weight of Phenolite VH-4170, 47.3 parts by weight of Fire Guard FG-2000 and 71.7 parts by weight of YPB-40 were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

Comparative Example 6

100 parts by weight of Epiclon N-865, 35.3 parts by weight of Phenolite VH-4170 and 47.3 parts by weight of Fire Guard FG-2000 were dissolved in methyl ethyl ketone, and 0.3 part by weight of 1-cyanoethyl-2-ethyl-4-methylimidazole was blended as curing accelerator to prepare a varnish with a nonvolatile content of 70% by weight.

Comparative Example 7

100 parts by weight of Epiclon N-865, 35.3 parts by weight of Phenolite VH-4170, 47.3 parts by weight of Fire Guard FG-2000 and 61 parts by weight of YPB-40 were dissolved in methyl ethyl ketone, and 0.3 part by weight of 1-cyanoethyl-2-ethyl-4-methylimidazole was blended as curing accelerator to prepare a varnish with a nonvolatile content of 60% by weight.

Each of the varnishes produced in Examples 9 to 16 and Comparative Examples 6 and 7 was applied to a 0.018 mm thick copper foil and heated at 160° C. for 3 minutes to obtain a copper foil having a 50 μm thick adhesive layer (resin coated copper foil). The thus obtained resin coated copper foil was placed on both sides of a 0.4 mm thick circuit-formed printed wiring board (MCL E-679 (trade name) produced by Hitachi Chemical Company, Ltd.) with the adhesive side of each copper foil facing the board, and pressed under the conditions of 175° C., 2.5 MPa and 90 minutes to make a copper-clad laminate with interlayer circuits.

Each of the obtained copper-clad laminates with interlayer circuits was subjected to the determination of Tg, copper foil peel strength, solder heat resistance, water absorption and susceptibility to discoloration by heating. Results are shown in Tables 3 and 4.

Regarding the copper-clad laminates with interlayer circuits made by using the varnishes obtained in Comparative Examples 3 to 5, there were shown (in Table 4) the same data as given above concerning Tg, copper foil peel strength, solder heat resistance and water absorption, but as regards susceptibility to discoloration by heating, the result of the test described below was shown in Table 4.

TABLE 3

| ITEMS | | EXAMPLE | | | | | | | |
|---|---|---|---|---|---|---|---|---|---|
| | | 9 | 10 | 11 | 12 | 13 | 14 | 15 | 16 |
| Tg (° C.) | | 174 | 173 | 176 | 174 | 174 | 173 | 141 | 178 |
| COPPER FOIL PEEL STRENGTH (kN/m) | ORDINARY STATE | 1.5 | 1.6 | 1.5 | 1.6 | 1.6 | 1.5 | 1.6 | 1.5 |
| | 200° C. | 0.7 | 0.7 | 0.8 | 0.7 | 0.7 | 0.6 | 0.6 | 0.8 |
| SOLDER HEAT RESISTANCE | | ○ | ○ | ○ | ○ | ○ | ○ | ○ | ○ |
| WATER ABSORPTION (%) | | 0.6 | 0.6 | 0.4 | 0.6 | 0.6 | 0.5 | 0.4 | 0.5 |
| SUSCEPTIBILITY TO DISCOLORATION BY HEATING | | ○ | ○ | ○ | ○ | ○ | ○ | ○ | ○ |

TABLE 4

| ITEMS | | COMP. EXAMPLE | | | | |
|---|---|---|---|---|---|---|
| | | 6 | 7 | 3 | 4 | 5 |
| Tg (° C.) | | 180 | 178 | 163 | 158 | 118 |
| COPPER FOIL PEEL STRENGTH (kN/m) | ORDINARY STATE | 1.2 | 1.3 | 1.6 | 1.5 | 1.7 |
| | 200° C. | 0.4 | 0.4 | 0.6 | 0.6 | 0.1 |
| SOLDER HEAT RESISTANCE | | ○ | ○ | Δ | Δ | x |
| WATER ABSORPTION (%) | | 0.6 | 0.5 | 0.7 | 0.6 | 1.0 |
| SUSCEPTIBILITY TO DISCOLORATION BY HEATING | | ○ | ○ | x | x | ○ |

The tests and determinations were conducted according to the methods described above, but susceptibility to discoloration by heating was evaluated by etching the copper foil, placing the laminate in the air at 160° C. for 5 hours and then visually observing its change of color. ○: Not discolored at all; Δ: Slightly discolored; x: Discolored.

Examples 9 to 16 showed a high copper foil peel strength (1.5 kN/m or above) in the ordinary state and maintained approximately 50% of the ordinary state peel strength even at 200° C., indicating that the deterioration at high temperatures is small. Also, because of the use of a bisphenol A novolak (bisphenol A/formaldehyde condensate) as curing agent, Examples 9 to 16 had a high Tg in the range of 140 to 180° C., showed high solder heat resistance and little susceptibility to discoloration by heating and were low in water absorption.

In contrast, Comparative Examples 6 and 7 were low in copper foil peel strength in the ordinary state and at 200° C.

Industrial Applicability

The resin coated copper foil according to the present invention has low water absorption, high heat resistance and good adhesion to the copper foils, so that it is possible to obtain a copper-clad laminate with excellent properties by laminating interlayer circuit boards to the present resin coated copper foils, and to obtain a printed wiring board by forming circuits on the copper-clad laminate.

What is claimed is:

1. A resin coated copper foil obtained by applying on one side of a copper foil, an adhesive composition comprising as essential components:
   (a) an epoxy resin in an amount of 100 parts by weight;
   (b) a polyfunctional phenol in an amount wherein the phenolic hydroxyl group is in the range of 0.5 to 1.5 equivalent to one equivalent of the epoxy group; said polyfunctional phenol selected from the group consisting of bisphenol F, bisphenol A, bisphenol S, polyvinyl phenol, and novolak resins, wherein said novolak resins are obtained by reacting phenols with aldehydes;
   (c) a curing accelerator in an amount of 0.01 to 5 parts by weight per 100 parts by weight of the epoxy resin; and
   (d) a compound having a triazine or an isocyanuric ring in an amount wherein the nitrogen content is 0.1 to 10% by weight of the total amount of resin solid matter of (a), (b), and (c), said compound selected from the group consisting of:
   a compound having a triazine ring represented by the general formula (I):

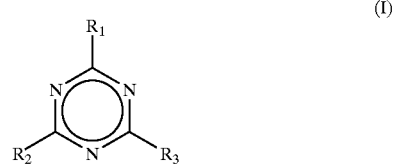

(I)

wherein $R_1$, $R_2$, and $R_3$ represent independently an amino group, an alkyl group, a phenyl group, a hydroxyl group, a hydroxyalkyl group, an ether group, and ester group, an acid group, an unsaturated group, or a cyano group;
a compound having an isocyanuric ring represented by the general formula (II):

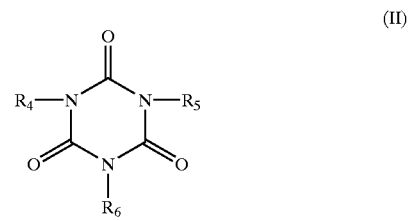

(II)

wherein $R_4$, $R_5$, and $R_6$ represent independently an amino group, an alkyl group, a phenyl group, a hydroxyl group, a hydroxyalkyl group, an ether group, and ester group, an acid group, an unsaturated group, or a cyano group; and
a polycondensate of a phenol, a compound of formula (I) or (II), and an aldehyde.

2. A resin coated copper foil according to claim 1, wherein the adhesive composition further comprises a flame retardant.

3. A copper-clad laminate obtained by laminating the resin coated copper foils set forth in claim 1 or 2, on an interlayer circuit board.

4. A copper-clad laminate according to claim 3, wherein the resin coated copper foil is provided with holes.

5. A printed wiring board obtained by forming circuits on the copper-clad laminate set forth in claim 3.

* * * * *